United States Patent
Tateno et al.

(10) Patent No.: US 10,217,823 B2
(45) Date of Patent: Feb. 26, 2019

(54) SEMICONDUCTOR DEVICE

(71) Applicants: SUMITOMO ELECTRIC INDUSTRIES, LTD., Osaka (JP); TOHOKU UNIVERSITY, Sendai-shi, Miyagi (JP)

(72) Inventors: Yasunori Tateno, Yokohama (JP); Masaki Ueno, Itami (JP); Masaya Okada, Itami (JP); Fuminori Mitsuhashi, Itami (JP); Maki Suemitsu, Sendai (JP); Hirokazu Fukidome, Sendai (JP)

(73) Assignees: SUMITOMO ELECTRIC INDUSTRIES, LTD., Osaka (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 15/840,590

(22) Filed: Dec. 13, 2017

(65) Prior Publication Data
US 2018/0166537 A1    Jun. 14, 2018

(30) Foreign Application Priority Data
Dec. 14, 2016 (JP) .................. 2016-242417

(51) Int. Cl.
*H01L 29/06* (2006.01)
*H01L 29/16* (2006.01)
(Continued)

(52) U.S. Cl.
CPC .......... *H01L 29/1606* (2013.01); *H01L 21/02* (2013.01); *H01L 21/0228* (2013.01);
(Continued)

(58) Field of Classification Search
CPC ... H01L 2924/13088; H01L 2924/1306; H01L 21/02164; H01L 21/02178
See application file for complete search history.

(56) References Cited

U.S. PATENT DOCUMENTS

| 2011/0089995 A1 | 4/2011 | Heo et al. |
| 2011/0220865 A1 | 9/2011 | Miyata et al. |
(Continued)

FOREIGN PATENT DOCUMENTS

| JP | 2011-192667 | 9/2011 |
| JP | 2016-58449 | 4/2016 |

OTHER PUBLICATIONS

Merc, et al., Graphene field-effect transistors based on boron nitride gate dielectrics, Columbia University, IEEE 2010, IEDM 10-556-10-559.

(Continued)

*Primary Examiner* — Samuel Gebremariam
(74) *Attorney, Agent, or Firm* — Smith, Gambrell & Russell, LLP.

(57) ABSTRACT

An electron device having a channel layer made of graphene is disclosed. The electron device includes a graphene layer on a substrate, and a source electrode, a drain electrode, and a gate insulating film on the graphene layer. The electron device further includes a first gate electrode on the gate insulating film between the source electrode and the drain electrode, and a second gate electrode within the substrate. For the second gate electrode, another gate insulating film is on the graphene layer, or alternatively, a part of the substrate is interposed between the second gate electrode and the channel layer.

12 Claims, 5 Drawing Sheets

(51) Int. Cl.

| | | |
|---|---|---|
| *H01L 21/311* | (2006.01) | |
| *H01L 29/423* | (2006.01) | |
| *H01L 29/10* | (2006.01) | |
| *H01L 29/417* | (2006.01) | |
| *H01L 29/51* | (2006.01) | |
| *H01L 29/786* | (2006.01) | |
| *H01L 29/45* | (2006.01) | |
| *H01L 29/49* | (2006.01) | |
| *H01L 29/66* | (2006.01) | |
| *H01L 21/02* | (2006.01) | |
| *H01L 21/04* | (2006.01) | |
| *H01L 51/05* | (2006.01) | |

(52) U.S. Cl.
CPC .. *H01L 21/02164* (2013.01); *H01L 21/02178* (2013.01); *H01L 21/02378* (2013.01); *H01L 21/02381* (2013.01); *H01L 21/02527* (2013.01); *H01L 21/02631* (2013.01); *H01L 21/04* (2013.01); *H01L 21/043* (2013.01); *H01L 21/044* (2013.01); *H01L 21/311* (2013.01); *H01L 21/31116* (2013.01); *H01L 21/31144* (2013.01); *H01L 29/10* (2013.01); *H01L 29/1079* (2013.01); *H01L 29/16* (2013.01); *H01L 29/417* (2013.01); *H01L 29/41733* (2013.01); *H01L 29/41775* (2013.01); *H01L 29/423* (2013.01); *H01L 29/42364* (2013.01); *H01L 29/42372* (2013.01); *H01L 29/42384* (2013.01); *H01L 29/45* (2013.01); *H01L 29/49* (2013.01); *H01L 29/4908* (2013.01); *H01L 29/51* (2013.01); *H01L 29/517* (2013.01); *H01L 29/66* (2013.01); *H01L 29/66045* (2013.01); *H01L 29/786* (2013.01); *H01L 29/78648* (2013.01); *H01L 29/78684* (2013.01); *H01L 29/78696* (2013.01); *H01L 51/05* (2013.01)

(56) References Cited

U.S. PATENT DOCUMENTS

| | | | |
|---|---|---|---|
| 2012/0056161 A1* | 3/2012 | Avouris | H01L 29/1606 257/24 |
| 2012/0228773 A1 | 9/2012 | Brown et al. | |
| 2013/0189444 A1 | 7/2013 | Kub et al. | |
| 2013/0240984 A1 | 9/2013 | Cheng et al. | |
| 2014/0151643 A1* | 6/2014 | Farmer | H01L 29/1606 257/29 |
| 2014/0176186 A1 | 6/2014 | Lee et al. | |
| 2014/0332852 A1 | 11/2014 | Dewey et al. | |
| 2016/0071982 A1 | 3/2016 | Tateno et al. | |

OTHER PUBLICATIONS

Schwierz, F., Graphene Transistors: Status, Prospects, and Problems, Proceedings of the IEEE, vol. 101, No. 7, pp. 1567-1584 (2013).

Henri Jussila et al., "Surface plasmon resonance for characterization of large-area atomic-layer grapheme film," *Optica*, vol. 3, No. 2, 151-158 (2016).

Gong Gu et al.,"Field Effect in Epitaxial Graphene on a Silicon Carbide Substrate", *Applied Physics Letters*, 2007, pp. 253507-1-25507-3, vol. 90.

Peter Sutter, "Epitaxial Graphene: How Silicon Leaves the Scene," *Natural Materials*, vol. 8, Mar. 2009, pp. 171-172.

\* cited by examiner

SEMICONDUCTOR DEVICE

CROSS REFERENCE TO RELATED APPLICATION

The present application is related to the following commonly-assigned U.S. Patent Applications: U.S. Ser. No. 14/844,996, entitled: SEMICONDUCTOR DEVICE WITH GRAPHENE LAYER AS CHANNEL, now issued as U.S. Pat. No. 9,741,859; and U.S. Ser. No. 15/804,677, entitled: FIELD EFFECT TRANSISTOR INCLUDING GRAPHENE LAYER, filed on Nov. 6, 2017; all of which are incorporated herein as references. Also, the present application claims the benefit of priority of Japanese Patent Application No. 2016-242417, filed on Dec. 14, 2016, which is incorporated herein by reference.

BACKGROUND OF INVENTION

1. Field of Invention

The present invention relates to an electron device primarily made of graphene.

2. Related Background Arts

Graphene is a sheet or a two-dimensional material made of carbons formed in six-membered ring, and shows extremely superior electron mobility. A transistor type of field effect transistor (FET) has been developed where a channel layer thereof is made of graphene. A dual gate FET with the channel layer made of graphene has been also known in the field such as that disclosed in U.S. patent application Ser. No. 14/844,996.

In a dual-gate FET, the second gate electrode provided closer to the drain electrode may suppress injection of holes into the channel beneath the first gate electrode provided closer to the source electrode, which may decrease the drain conductance and enhance a maximum oscillation frequency fmax of the FET. However, practically observed maximum oscillation frequency fmax is still lower than the theoretically estimated oscillating frequency.

SUMMARY OF INVENTION

An aspect of the present invention relates to a semiconductor device that includes a substrate, a channel layer provided on the substrate, electrodes of the source and the drain on the channel layer, an insulating film on the channel layer between the source electrode and the drain electrode, a first gate electrode on the insulating film, and second gate electrode. The channel layer is made of graphene. A feature of the semiconductor device of the present invention is that the second gate electrode is provided within the substrate, that is, the second gate electrode is arranged in a side opposite to the first gate electrode so as to sandwich the channel layer therebetween.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiments according to the present invention will be described while referring to accompanying drawings. However, each embodiment to be described should be considered in all respects as illustrative and not restrictive, and the scope of the invention should be determined by the appended claims and their equivalents. Also, in the description of the drawings, numerals or symbols the same as or similar to each other will refer to elements the same as or similar to each other without duplicating explanations.

First Embodiment

Figure 1:
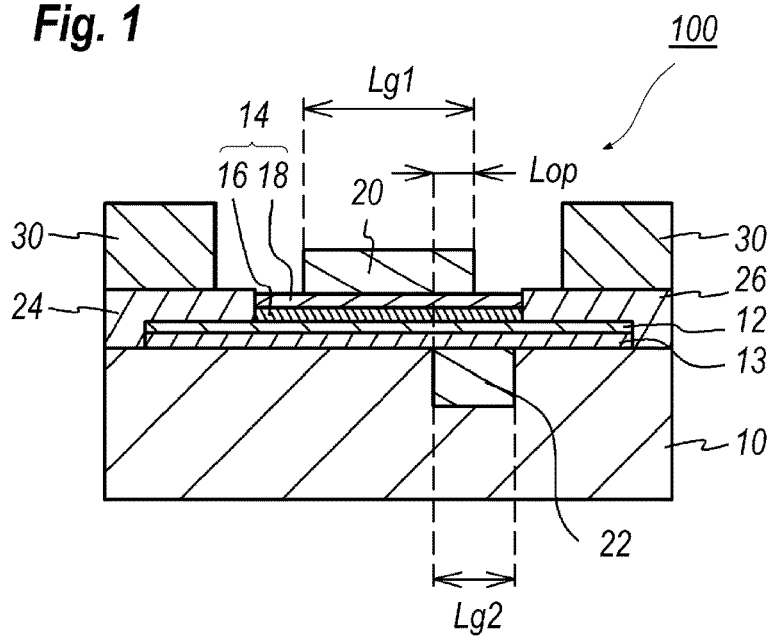
FIG. 1 shows a cross section of a field effect transistor (FET) according to the first embodiment of the present invention.

FIG. 1 shows a cross section of a field effect transistor (FET) according to the first embodiment of the present invention. The FET 100 shown in FIG. 1 provides a channel layer 12 made of graphene on a substrate 10 through an insulating film 13. The FET 100 removes the channel layer 12 and the insulating film 13 outside of an active region. The channel layer 12 provides a source electrode 24 and a drain electrode 26 thereon; and further provides a first gate electrode 20 between a source electrode 24 and a drain electrode 26 on an insulating film 14. Moreover, a second gate electrode 22 is provided between the first gate electrode 20 and the drain electrode 26, where the second gate electrode 22 is provided within the substrate 10. A gate insulating film 14 includes an aluminum oxide film 16 on the channel layer 12 and a silicon oxide film 18 on the aluminum oxide film 16. The insulating film 13 beneath the channel layer 12, which may operate as a gate insulating film for the second gate electrode 22, may be made of silicon oxide. The FET 100 may further provide interconnections 30 extracted from the source electrode 24 and the drain electrode 26.

The specification below assumes that the first gate electrode 20 and the second gate electrode 22 have gate lengths of Lg1 and Lg2, respectively; and an overlapping length therebetween is Lop.

Figure 2:
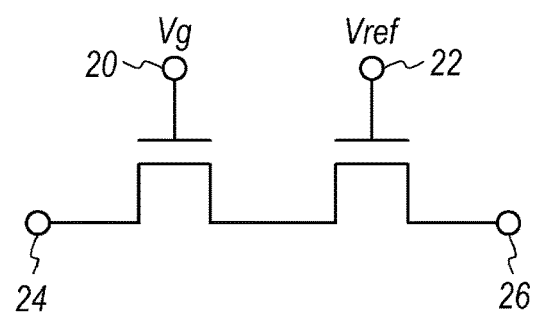
FIG. 2 shows an equivalent circuit diagram of the FET shown in FIG. 1.

FIG. 2 shows an equivalent circuit diagram of the FET 100 shown in FIG. 1. The equivalent circuit diagram provides the first gate electrode 20 and the second gate electrode 22 between the source electrode 24 and the drain electrode 26. The first gate electrode 20 receives a signal Vg, while the second gate electrode 22 receives a reference Vref. By adjusting the reference Vref, the hole injection from the drain electrode 26 into a region beneath the first gate electrode 20 may be effectively suppressed. Accordingly, even if the drain electrode 26 is applied with a high bias voltage, the channel in the channel layer 12 may be free from the hole injection, which means that the drain current effectively saturates and the drain conductance becomes small enough. Thus, the FET 100 may enhance various performances such as the maximum oscillation frequency fmax and so on. The reference Vref is preferably higher than the bias Vg applied to the first gate electrode. For instance, the second gate electrode 22 may be electrically connected with the source electrode 24, that is, the level of the second gate electrode 22 is equal to the level of the source electrode 24, and the source electrode 24 is often grounded.

The FET 100 of the present embodiment provides the second gate electrode 22 within the substrate 10, accordingly, the a distance between the first gate electrode 20 and the second gate electrode 22 may be shorter, or in the first embodiment of the FET 100, two gate electrodes, 20 and 22, are partially overlapped. This arrangement may become effective for the FET 100 to enhance the performances thereof such as the current gain, the maximum oscillation frequency fmax, and so on.

Because the two gate electrodes, 20 and 22, are partially overlapped, the channel layer 12 between the two gates electrodes, 20 and 22, disappears in a lateral direction thereof, which may effectively reduce channel resistance, and the performance of the FET 100, namely, the current gain, the maximum oscillation frequency fmax, the cut-off frequency ft, and so on, may be enhanced. The overlapping length Lop between the two gate electrodes, 20 and 22, is preferably greater than 5% of the gate length Lg1 of the frist gate electrode 20, or the 10% greater than the gate length Lg1 is further preferably. An excessive overlap results in a situation where the first gate electrode 20 may not operate as a gate electrode. Accordingly, the overlapping length Lop is preferably shorter than a half of the gate length Lg1 of the first gate electrode 20. The first gate length Lg1 is preferably greater than 0.1 μm because an excessively shorter gate length results in an increase of gate resistance along a direction crossing the channel, besides, such a shorter gate length becomes hard or unable to be formed during the process. The second gate length Lg2 is preferably shorter than a half of the first gate length Lg1 to reduce resistance between the first gate electrode 20 and the drain electrode 26.

The second gate electrode 22 preferably puts the insulating film 13 against the channel layer 12, which securely and electrically isolates the second gate electrode 22 from the channel layer 12. The second gate electrode 22 receives the reference Vref to suppress the hole injection from the drain electrode 26 into the channel layer 12. The reference Vref in a level thereof is preferably higher than the level of the bias applied to the first gate electrode 20. Thus, the second gate electrode 22 is preferably connected with the source electrode 24. The gate insulating film 14 may be a dual layer including the aluminum oxide film 16 that is in contact with the channel layer 12 and the silicon oxide film 18, which may equivalently thicken the gate insulating film 14.

Second Embodiment

Figure 3:
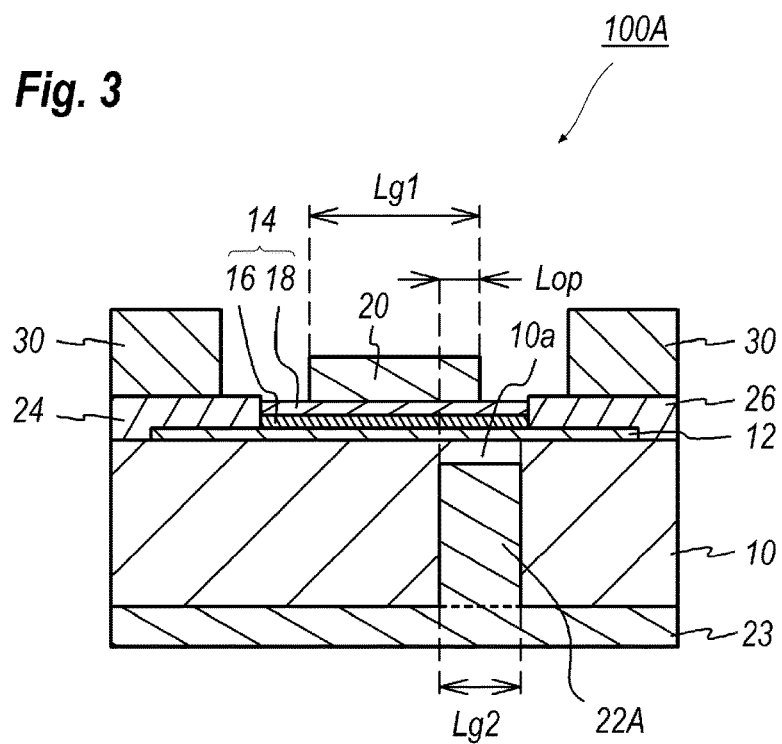
FIG. 3 shows a cross section of another FET according to the second embodiment of the present invention.

FIG. 3 shows a cross section of an FET according to the second embodiment of the present invention. The FET 100A shown in FIG. 3 has a feature that channel layer 12 accompanies with no gate insulating film against the second gate electrode 22A, where the gate electrode 22A is provided within a bore formed in the substrate 10 so as to leave a portion 10a in a deep end of the bore. The substrate 10 in a portion 10a thereof is left between the channel layer 12 and the second gate electrode 22A, where the left portion 10a of the substrate 10 operates as a gate insulating film.

Figure 4A:
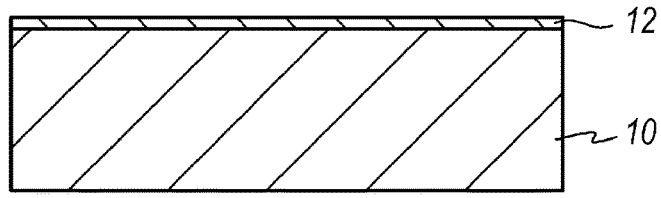
FIG. 4A to FIG. 4C show cross sections of the FET shown in FIG. 3 at respective processes of forming the FET.
Figure 4B:
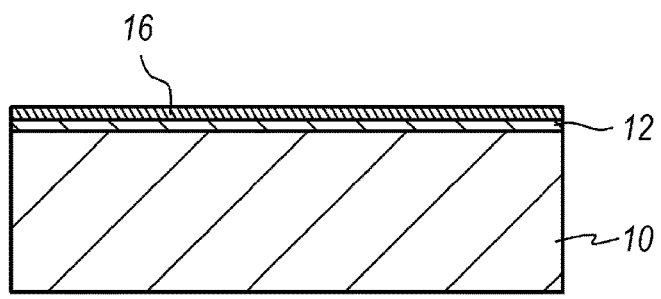

Next, a process of forming the FET 100A shown in FIG. 3 will be described. FIGS. 4A to 6C show cross sections of the FET 100A at respective processes. First, as shown in FIG. 4A, the process processes rinse a surface of 6H-SiC substrate 10 by procedures of soaking the substrate 10 within acetone for 5 minutes, within ethanol for 5 minutes, and within water for 5 minutes, sequentially in this order. In an alternative, the substrate 10 is treated with, what is called, the RCA process. Also in an alternative, the substrate 10 may be a silicon (Si) substrate providing a SiC layer thereon. When thermal sublimation is used for growing the channel layer 12, the substrate 10 in a top surface thereof is necessary to provide the SiC layer. On the other hand, when the CVD (Chemical Vapor Deposition) is used, the substrate 10 in the top surface thereof is unnecessary to be made of SiC.

In the present embodiment, the process forms the channel layer 12 on the SiC substrate 10 by the thermal sublimation. Specifically, heat-treating the SiC substrate 10 at 1600° C. for one (1) minute within an argon (Ar) atmosphere, the channel layer 12 is formed on the SiC substrate 10 by a thickness of 0.35 to 0.7 nm. The heat treatment of the SiC substrate 10 may sublimate silicon (Si) atoms and bind carbon (C) atoms with SP2 orbital. Thus, the channel layer 12 is converted from the SiC substrate 10. The temperature, the period, and the atmosphere during the heat treatment may optionally determine the thickness of the converted channel layer 12. Substantially vacuum atmosphere may be applicable for the heat treatment. In order to obtain a thinner graphene layer, an atmosphere with an inert gas, or inert gases, is preferable.

Thereafter, a metal evaporation may deposit a metal film made of aluminum (Al) with a thickness of 5 nm. In an alternative, a metal sputtering may also deposit the Al film. Exposing a thus formed Al film in an air, or an atmosphere containing oxygen (02) for about 24 hours, the atmosphere may naturally oxidize the Al film and form an aluminum oxide film 16. In an alternative, the aluminum oxide film 16 may be directly formed by, what is called, the atomic layer deposition (ALD) technique.

Figure 4C:
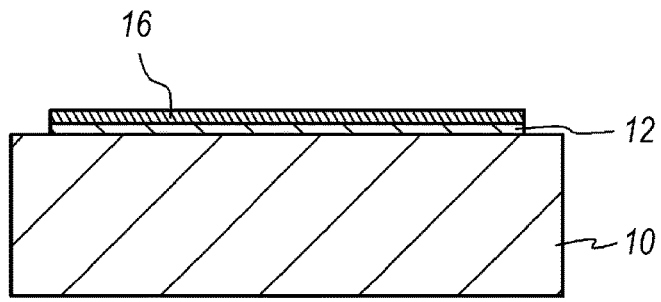

Thereafter, a portion of the aluminum oxide film 16 and the channel layer 12 outside of an active region are removed using an etching mask, such as a patterned photoresist, as shown in FIG. 4C. An aluminum oxide film 16 may be etched by, for instance, an alkali developer for a photoresist. The channel layer 12 may be removed by, for instance, oxygen plasma.

Figure 5A:
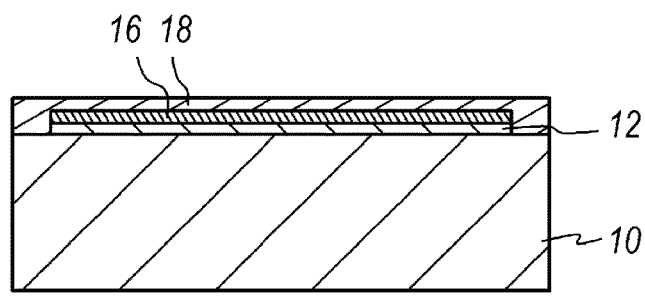
FIG. 5A to FIG. 5C show cross sections of the FET shown in FIG. 3 at respective processes subsequent to that shown in FIG. 4C.

Thereafter, the process forms a silicon oxide film 18 on the substrate 10 and the aluminum oxide film 16, as shown in FIG. 5A. The silicon oxide film 18, which may be formed by the CVD technique, has a thickness of about 30 nm. The silicon oxide film 18 is to equivalently thicken the gate insulating film 14 that contains the aluminum oxide film 16 and the silicon oxide film 18. However, the gate insulating film 14 is not restricted to the combination of the two films, 16 and 18. Materials except for the two materials may be applicable to the gate insulating film. Also, the gate insulating film 14 may be a mono layer.

Figure 5B:
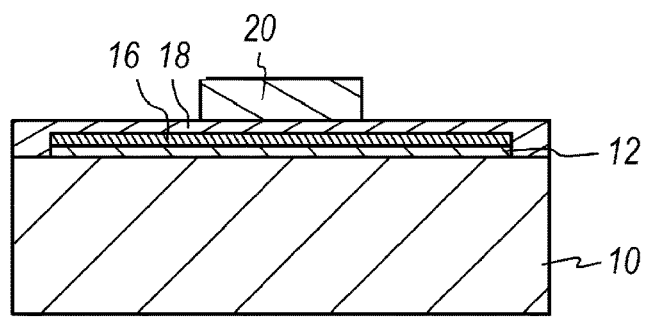

Then, as shown in FIG. 5B, the process forms the first gate electrode 20 on the silicon oxide film 18. The first gate electrode 20 may be made of stacked metal of, from a side of the silicon oxide film 18, titanium (Ti) film with a thickness of 10 nm and gold (Au) film with a thickness of 100 nm. The Ti film and the Au film of the first gate electrode 20 may be formed by, for instance, the metal evaporation and the lift-off technique subsequent to the metal evaporation. In an alternative, the Au film may be replaced with, for instance, aluminum (Al) and so on. From a viewpoint of reducing gate resistance, a primary portion of the gate electrode 20 may be formed by, or include a material with low resistivity.

Figure 5C:
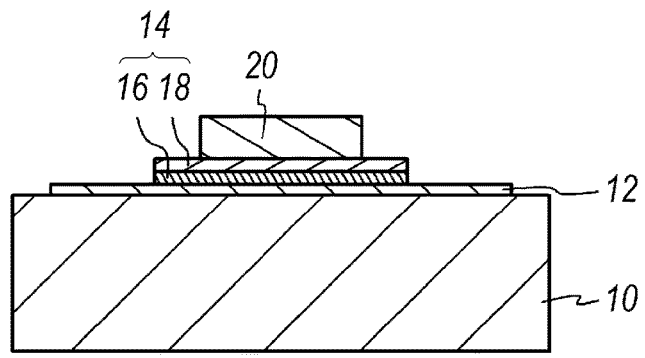
Figure 6A:
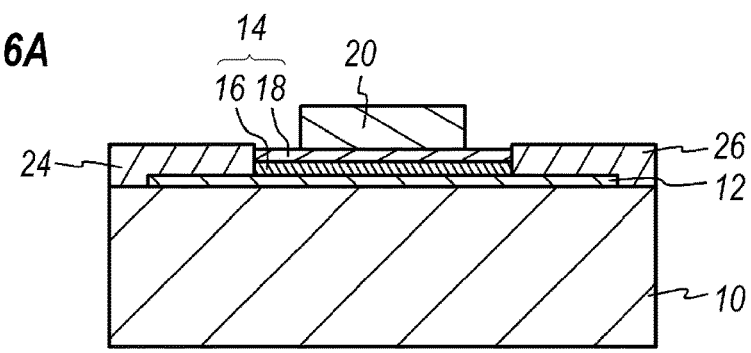
FIG. 6A to FIG. 6C show cross sections of the FET shown in FIG. 3 at respective processes subsequent to that shown in FIG. 5C.

Thereafter, as shown in FIG. 5C, the silicon oxide film 18 and the aluminum oxide film 16 are partially removed by the dry-etching, typically, a reactive ion etching (RIE), using a patterned photoresist as a mask. The metal evaporation using another patterned photoresist and subsequent lift-off technique may form the electrodes of the source 24 and the drain 26 electrodes as shown in FIG. 6A. The source electrode 24 and the drain electrode 26 may be made of nickel (Ni) with a thickness of around 15 nm.

Figure 6B:
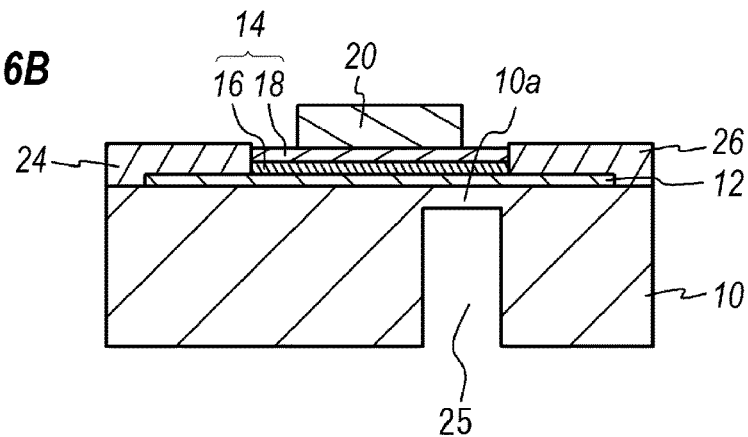
Figure 6C:
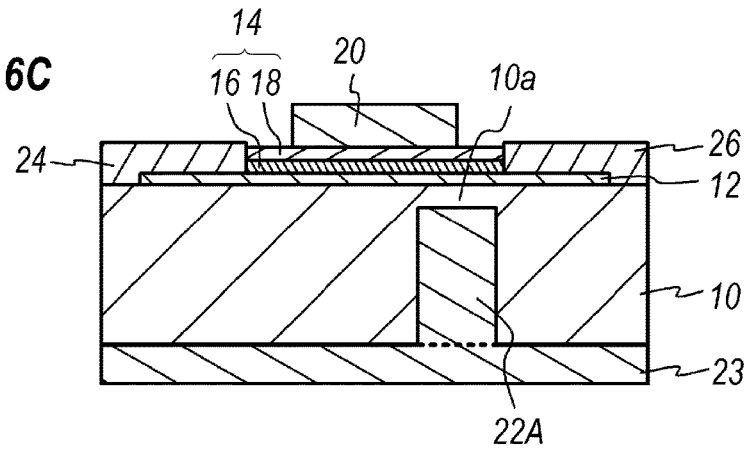

Then, the process forms a bore 25 in the substrate 10 from a back surface thereof as shown in FIG. 6B by the dry-etching. The bore 25 has a bottom, or leaves a portion 10a of the substrate 10 in the deep end thereof, where the portion of the substrate 10a left in the deep end of the bore 25 may have a thickness of about 500 nm, or preferably 300 to 700 nm. Because the second gate electrode 22A formed in the bore 25 is to provide the reference to the channel layer 12, the left portion 10a of the substrate 10 in the deep end of the bore 25 is unnecessary to be precisely controlled as that of the insulating film 14 for the first gate electrode 20.

Filling the bore 25 with a metal by, for instance, metal plating, the second gate electrode 22A may be formed. Concurrently with the formation of the second gate electrode 22, the process may form a back metal 23 in the back surface of the substrate 10. Thus, the second gate electrode 22A securely continues with the back metal 23, which is to be grounded.

Thereafter, the metal evaporation and the subsequent lift-off technique may form interconnections 30 on the source electrode 24 and the drain electrode 26. The interconnections 30 may be a stacked metal of titanium (Ti) with the thickness of 10 nm and gold (Au) with a thickness of 100 nm from the side of the electrodes of the source 24 and the drain 26. Thus, the process of forming the FET 100A according to the second embodiment of the present invention may be completed.

The process thus described above first forms the first gate electrode 20, then, the electrodes of the source 24 and the drain 26 are formed. However, another process modified from the above may form the electrodes of the source 24 and the drain 26 first, then, forms the first gate electrode 20.

The FET 100A according to the second embodiment of the present invention provides the second gate electrode 22A under the channel layer 12, exactly, within the bore 25 formed from the back surface of the substrate 10, as interposition the left portion 10a of the substrate 10. Because the second gate electrode 22A is securely connected with the back metal 23 that is grounded, the second gate electrode 22A is also securely grounded. Besides, the source electrode 24 of the FET 100A is also grounded. Thus, the second gate electrode 22 is securely connected with the source electrode 24.

While a particular embodiment of the present invention has been described herein for purposes of illustration, many modifications and changes will become apparent to those skilled in the art. Accordingly, the appended claims are intended to encompass all such modifications and changes as fall within the true spirit and scope of this invention.

We claim:

1. A semiconductor device, comprising:
   a substrate;
   a channel layer made of graphene and provided on the substrate;
   a source electrode and a drain electrode provided on the channel layer;
   an insulating film provided on the channel layer between the source electrode and the drain electrode;
   a first gate electrode provided on the insulating film between the source electrode and the gate electrode; and
   a second gate electrode provided within the substrate and between the first gate electrode and the drain electrode,
   wherein the first gate electrode is closer to the source electrode than the second gate electrode and partially overlaps the second gate electrode.

2. The semiconductor device according to claim 1,
   further including another insulating film provided between the channel layer and the second gate electrode.

3. The semiconductor device according to claim 2,
   wherein the another insulating film has a thickness of 15 nm.

4. The semiconductor device according to claim 1,
   wherein the second gate electrode is under a portion of the substrate that is under the channel layer, the substrate portion being interposed between the second gate electrode and the channel layer.

5. The semiconductor device according to claim 4,
   wherein the portion of the substrate interposed between the second gate electrode and the channel layer has a thickness of 300 to 700 nm.

6. The semiconductor device according to claim 1,
   wherein the first gate electrode has a portion closer to the source electrode and a portion closer to the drain electrode,
   wherein the second gate electrode has a portion closer to the source electrode and a portion closer to the drain electrode, and
   wherein the portion of the first gate electrode that is closer to the drain electrode overlaps with the portion of the second gate electrode that is closer to the source electrode.

7. The semiconductor device according to claim 6,
   wherein the first gate electrode overlaps the second gate electrode by at least 5% of a gate length of the first gate electrode in a direction from the source electrode to the drain electrode.

8. The semiconductor device according to claim 1,
   wherein the first gate electrode overlaps the second gate electrode by no more than a half of a gate length of the first gate electrode.

9. The semiconductor device according to claim 1,
   wherein the insulating film includes a first film made of aluminum oxide with a thickness of 5 nm and a second film made of silicon oxide with a thickness of 30 nm, the first film being provided on the channel layer and the second film being provided on the first film.

10. The semiconductor device according to claim 1,
    wherein the channel layer has a thickness of 0.35 to 0.70 nm.

11. The semiconductor device according to claim 1,
    wherein the source electrode and the drain electrode are made of nickel.

12. The semiconductor device according to claim 1,
    wherein the first gate electrode is made of stacked titanium (Ti) with a thickness of 10 nm and gold (Au) with a thickness of 100 nm.

* * * * *